United States Patent
Tamura (10) Patent No.: US 6,211,528 B1
(45) Date of Patent: *Apr. 3, 2001

(54) ELECTRON BEAM DRAWING METHOD IN WHICH CELL PROJECTION MANNER AND VARIABLY SHAPED BEAM MANNER ARE USED IN COMBINATION

(75) Inventor: Takao Tamura, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/055,755

(22) Filed: Apr. 7, 1998

(30) Foreign Application Priority Data

Apr. 10, 1997 (JP) .................................................... 9-092092

(51) Int. Cl.$^7$ ..................................................... H01J 37/302
(52) U.S. Cl. ................................. 250/492.22; 250/492.23
(58) Field of Search ........................... 250/492.22, 492.23

(56) References Cited

U.S. PATENT DOCUMENTS 5,932,884 * 8/1999 Aizaki .............................. 250/492.22

FOREIGN PATENT DOCUMENTS

| 4-177717 | 6/1992 | (JP) . |
| 5-251318 | 9/1993 | (JP) . |
| 7-142360 | 6/1995 | (JP) . |

* cited by examiner

*Primary Examiner*—Jack Berman
(74) *Attorney, Agent, or Firm*—McGinn & Gibb, PLLC

(57) ABSTRACT

Whether a pattern region in which a pattern is drawn in a resist is a first region to be drawn in a cell projection manner or a second region to be drawn in a variably shaped beam manner is decided. Then a first exposure dose is selected if the pattern region is the first region or a second exposure dose is selected if the pattern region is the second region. The second exposure dose is different from the first exposure dose. The pattern is drawn with the first exposure dose in the first region and with the second exposure dose in the second region respectively.

16 Claims, 9 Drawing Sheets

| HEADER PART<br>T=0<br>K=1 | PATTERN DATA PART |
|---|---|
| HEADER PART<br>T=0<br>K=2 | PATTERN DATA PART |
| HEADER PART<br>T=0<br>K=3 | PATTERN DATA PART |

FIG. 6B

| HEADER PART<br>T=1<br>K=0 | PATTERN DATA PART |
|---|---|
| HEADER PART<br>T=1<br>K=0 | PATTERN DATA PART |

ELECTRON BEAM DRAWING METHOD IN WHICH CELL PROJECTION MANNER AND VARIABLY SHAPED BEAM MANNER ARE USED IN COMBINATION

BACKGROUND OF THE INVENTION

1. Field of the Invention

The present invention relates to an electron beam drawing method suitable for forming a fine pattern on a resist on a semiconductor substrate surface by an electron beam and more particularly, to an electron beam drawing method in which patterns of substantially the same size can be formed on a resist on a semiconductor substrate in a cell projection manner enabling a high speed formation of a fine pattern and in a conventional variably shaped beam manner.

2. Description of the Related Art

Figure 1A:
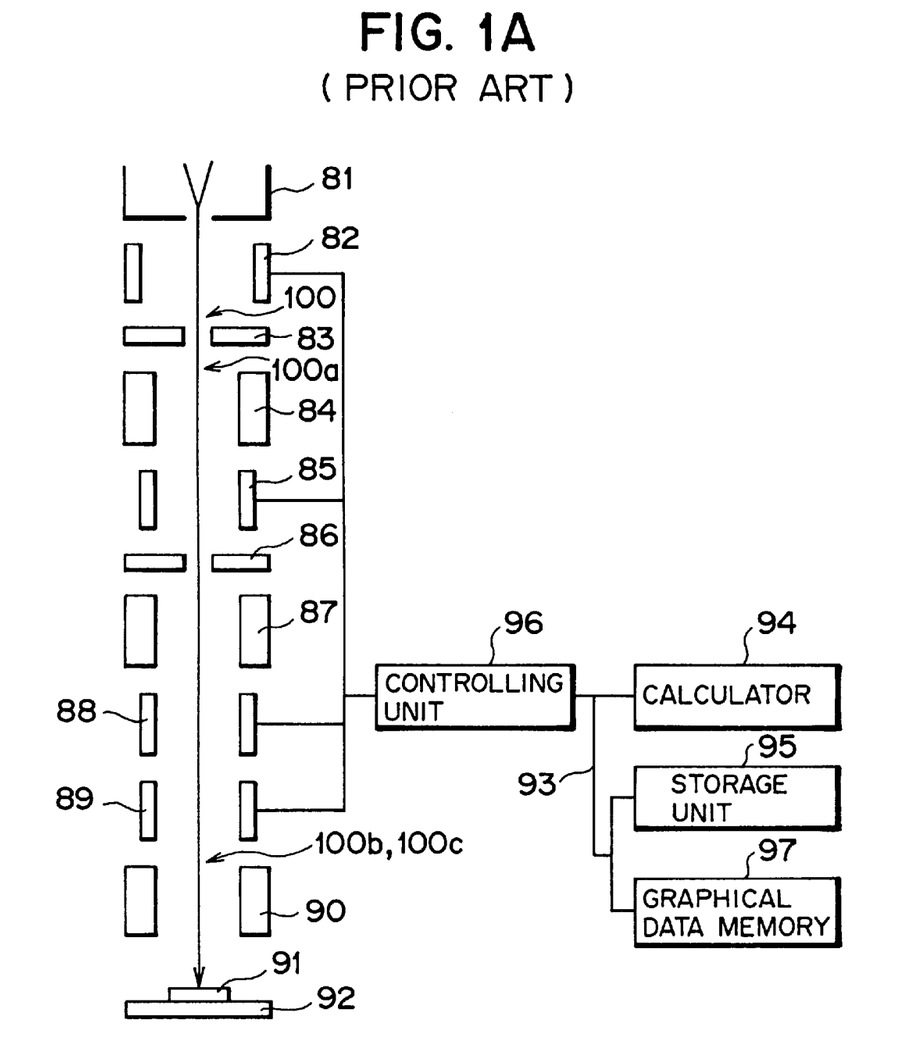
FIG. 1A is a schematic drawing showing a conventional electron beam exposure system and FIG. 1B is a schematic drawing showing a electron beam path passing through an aperture.
Figure 1B:
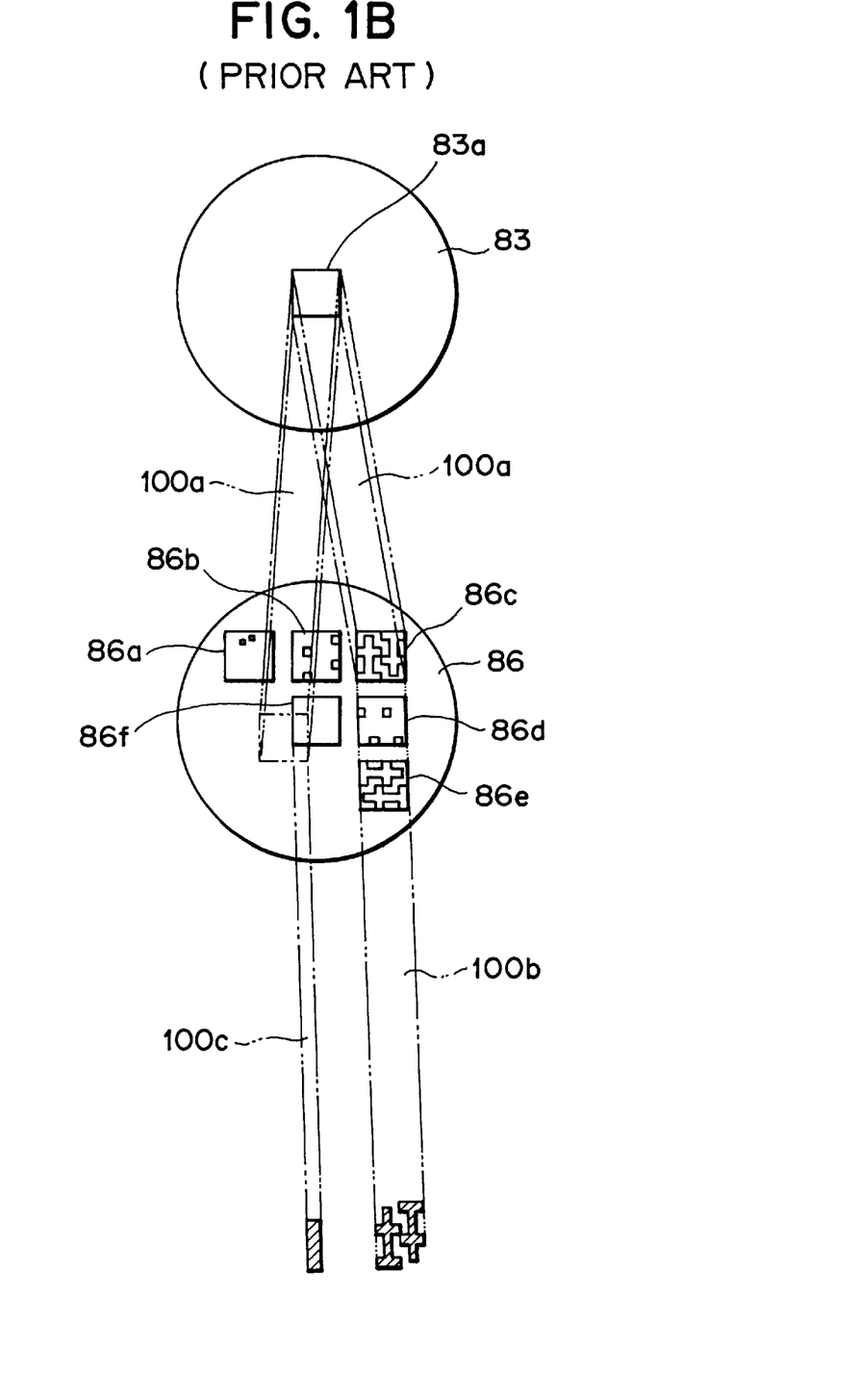

In company with progress of LSI, miniaturization of a pattern, which is used for a semiconductor device fabrication process, has also been rapidly advanced. A drawing method utilizing an electron beam is effective to cope with a future requirement for a width of a pattern as small as 0.25 μm or less in fabrication of a semiconductor device. FIG. 1A is a schematic drawing showing a conventional electron beam exposure system and FIG. 1B is a schematic drawing showing a beam path passing through an aperture. It should be noted that hatching is made on a drawn latent image in FIG. 1B. In the electron beam exposure system, a sample stage 92, on which a semiconductor wafer 91 coated with a resist on its surface is mounted, is disposed and an electron gun 81 is disposed above the sample stage 92 which gun generates an electron beam 100 being irradiated on the semiconductor wafer 91. There are provided, between the electron gun 81 and the sample stage 92 in the sequential order from the top, a blanking electrode 82, which controls ON/OFF of irradiation of the electron beam 100 to the semiconductor wafer 91, a first aperture 83, which has an opening 83a of a rectangular shape for transforming the electron beam 100 to an electron beam 100a of a rectangular shape in section, a beam shaping lens 84, which suppresses spreading of the electron beam 100a which has passed through the first aperture 83, a shaping deflector 85, which deflects the electron beam 110a, a second aperture 86, which has an opening for variably shaped beam drawing 86f of a rectangular shape and plural openings for cell projection drawing 86a to 86e for transforming the electron beam 100a in section to a cell projection beam 100b or a variably shaped beam 100c, a demagnifying lens 87, which suppresses spreading the cell projection beam 100b and the variably shaped beam 100c which have passed through the second aperture 86, a main deflector 88 and an auxiliary deflector 89, which deflect the cell projection beam 100b and the variably shaped beam 100c, and a projection lens 90, which controls focuses of the cell projection beam 100b and the variably shaped beam 100c.

The openings for cell projection drawing 86a to 86e have different shape from one another. In FIG. 1B, the cell projection beam 100b is an electron beam after the electron beam 100a has passed through the opening 86c.

A controlling unit 96, which controls the blanking electrode 82, the shaping deflector 85, the main deflector 88 and the auxiliary deflector 89, is connected to those portions. Besides, there are connected to the controlling unit 96, a calculator 94, in which processing such as expansion of data, sorting thereof and the like through a data bus 93 are conducted and an intensity of an electron beam is calculated, a storage unit 95, in which a graphical data to be drawn on the resist on the semiconductor wafer 91 is stored, and a graphical data memory 97, which temporarily stores the graphical data.

In an electron beam exposure system constituted in such a manner, the graphical data to be drawn on the resist on the semiconductor 91 is stored in the storage unit 95 and necessary processing such as expansion of data, sorting thereof and the like is performed in the calculator 94. At this point, a part of the processing result is temporarily stored in the graphical data memory 97 and is read out therefrom. The result of processing by the calculator 94 is transmitted to controlling unit 96 and the blanking electrode 82, the shaping deflector 85, the main deflector 88 and the auxiliary deflector 89 are controlled by the controlling unit 96. Thereby, the cell projection beam 100b or the variably shaped beam 100c of a desired shape can be irradiated to a desired position on the surface of the semiconductor substrate 91.

One or more patterns are transferred to form latent images in one shot of exposure by irradiating the cell projection beam 100b having plural patterns on the resist on the surface of the semiconductor wafer 91 by use of the above mentioned electron beam exposure system. Thereby, the throughput can be improved. A sectional area of the variably shaped beam 100c is determined by a degree of superposition between the opening 83a of the first aperture 83 and the opening for variably shaped beam drawing 86f of the second aperture 86. Thus, a pattern of an arbitrary sectional area can be formed as a latent image on the resist coated on the semiconductor wafer 91.

Figure 2:
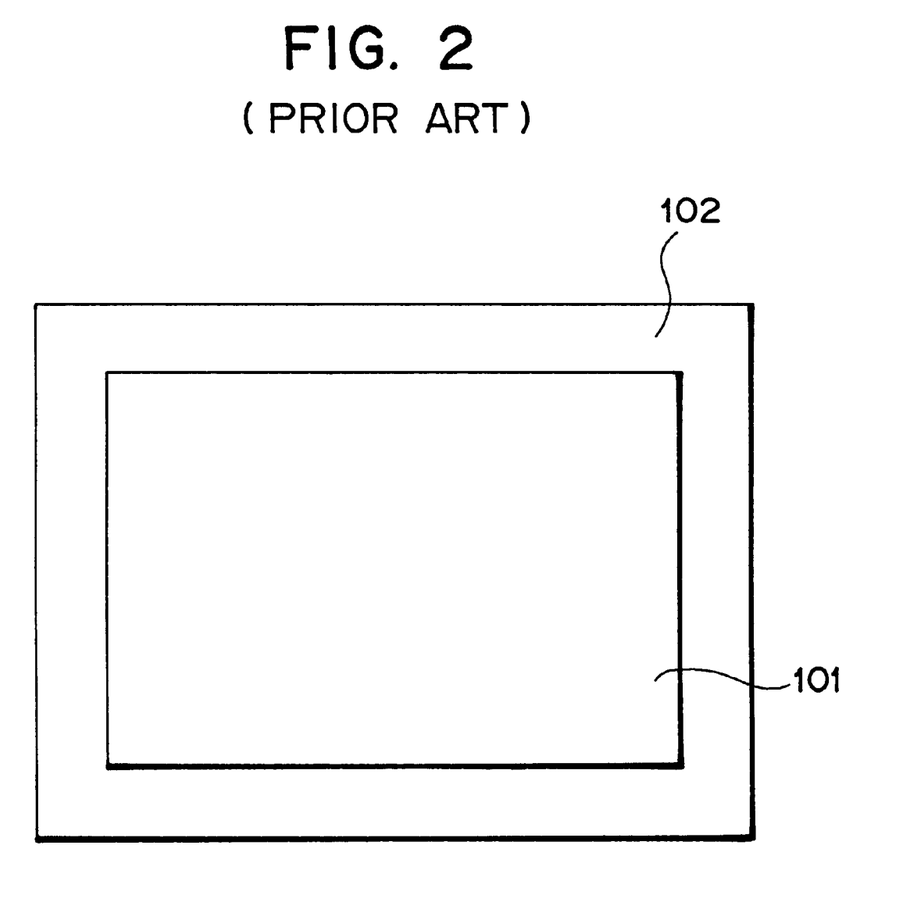
FIG. 2 is a schematic drawing showing a structure of DRAM.

For example, an exposure process in fabricating a Dynamic Random Access Memory (DRAM) will be described. FIG. 2 is a schematic drawing showing a structure of DRAM. DRAM is constructed with a memory cell array section 101, in which the same patterns in shape are disposed in a repeated manner and a peripheral circuit section 102, in which patterns are disposed in an irregular manner.

In the case where such a pattern of DRAM is exposed by use of the electron beams exposure system, the opening for variably shaped beam drawing 86f is selected to form the peripheral circuit section 102 and drawing in the variable shaped beam manner is performed. On the other hand, drawing in the cell projection manner is performed by selecting the opening for cell projection drawing 86a, 86b, 86c, 86d or 86e for formation of the memory cell array section 101.

Figure 3:
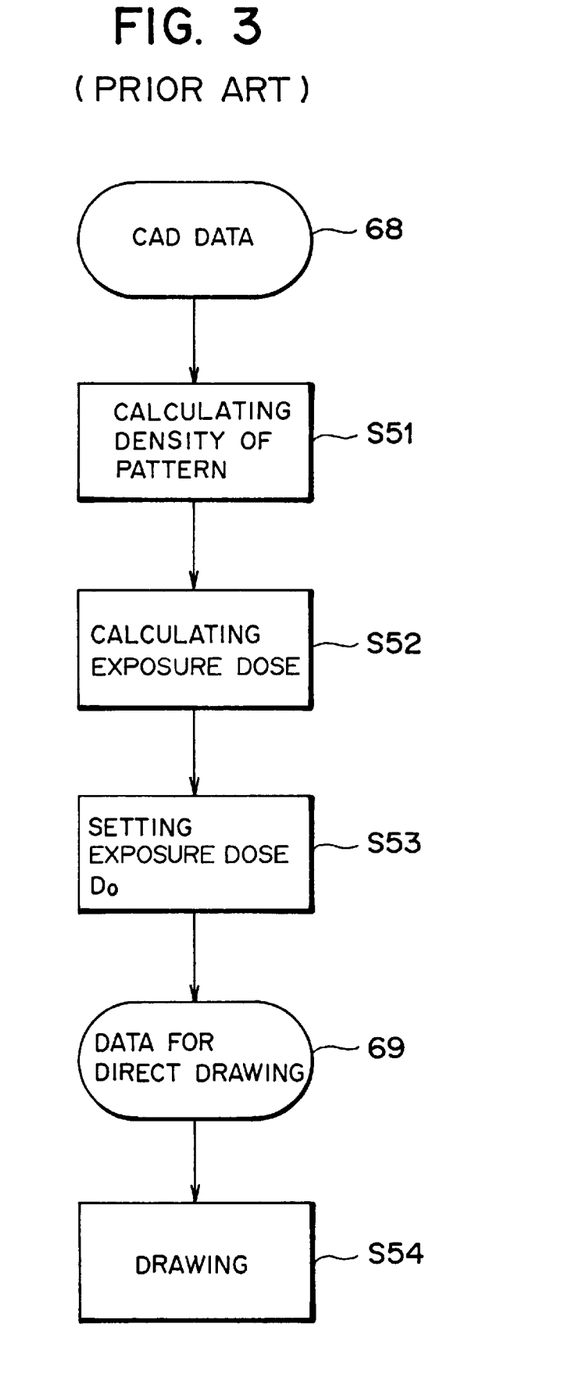
FIG. 3 is a flow chart showing a conventional production process for a graphical data.

In a conventional electron beam drawing method, a graphical data of a pattern is produced in the following way. FIG. 3 is a flow chart showing a conventional production process for a graphical data. First, a density of a drawing pattern present in a predetermined area is calculated based on a CAD data 68 (step S51). Then, a proximity effect correction is conducted based on the density to calculate an optimum exposure dose (step S52). Thereafter, an exposure dose $D_0$ is set regardless of whether the drawing pattern is transferred in the cell projection manner or the variably shaped beam manner (step S53). In such a manner, a data for direct drawing 69 is produced. The data for direct drawing 69 is the graphical data of the pattern. Electron beam drawing is performed by use of the data for direct drawing 69 (step S54).

However, there is a difference between an optimum exposure dose for a pattern drawn in the cell projection manner and an optimum exposure dose for a pattern drawn in the variably shaped beam manner. Therefore, when drawings are conducted with the same exposure doses $D_0$, difference in size arises between patterns drawn in the cell projection manner and the variably shaped beam manner.

Figure 4:
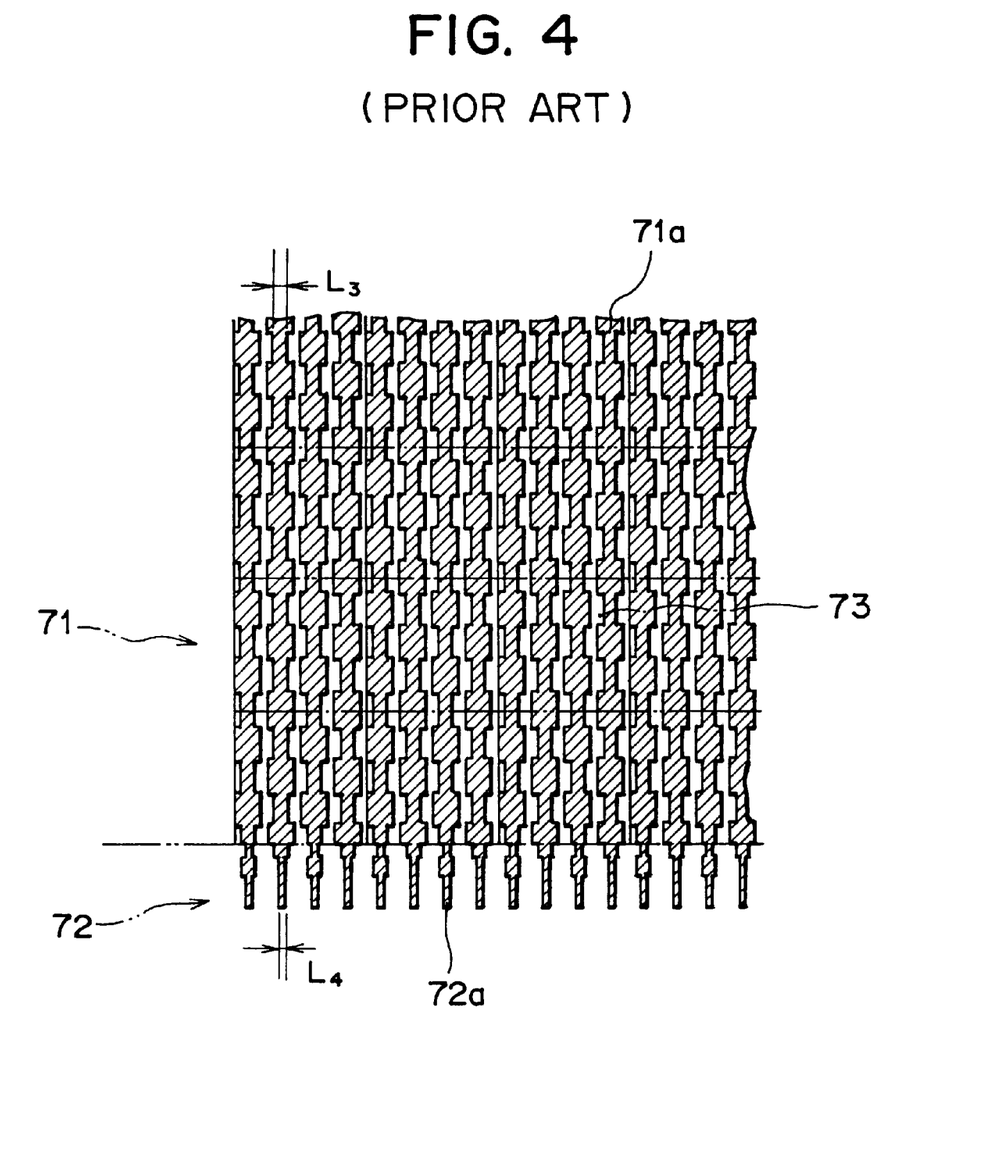
FIG. 4 is a schematic drawing showing a pattern formed by a conventional electron beam drawing method.

FIG. 4 is a schematic drawing showing a pattern formed by a conventional electron beam drawing method. It should be noted that hatching is made on a drawn latent image in FIG. 4. For example, in the case where a cell projection drawing region 71 in which plural repetitions of a basic portion 73 are disposed and a variably shaped beam drawing region 72 in the surrounding thereof are drawn with the same exposure doses $D_0$, a size $L_4$ of a pattern 72a drawn in the variably shaped beam manner is narrower than a size $L_3$ of a pattern 71a drawn in the cell projection manner.

There has been proposed a pattern formation method in which a fluctuation of a line width of a pattern is suppressed in a process step of developing or the like after drawing in Japanese Unexamined Patent Publication (Kokai) No. Hei 5-251318. In a conventional method disclosed in the publication, a fluctuation of a line width is predicted for each pattern forming region, and a dose of charged particles is adjusted based on the prediction.

However, even by this method, if there are a pattern to be drawn in the cell projection manner and a pattern to be drawn in the variably shaped beam manner in a mixed manner, there is a problem that sizes equal in magnitude cannot be achieved between both patterns.

SUMMARY OF THE INVENTION

It is an object of the present invention to provide an electron beam drawing method in which patterns drawn in a cell projection manner and a variably shaped beam manner can be attained with substantially the same sizes.

An electron beam drawing method in which a cell projection manner and a variably shaped beam manner are used in combination, according to the present invention, comprises the step of deciding on whether a pattern region in which a pattern is drawn in a resist is a first region to be drawn in a cell projection manner or a second region to be drawn in a variably shaped beam manner. The electron beam drawing method further comprises the step of selecting a first exposure dose if the pattern region is the first region or a second exposure dose if the pattern region is the second region. The second exposure dose is different from the first exposure dose. The electron beam drawing method further comprises the step of drawing the pattern with the first exposure dose in the first region and with second exposure dose in the second region respectively.

In the present invention, since different exposure doses are respectively set for a pattern to be drawn in the cell projection manner and a pattern to be drawn in the variably shaped beam manner, both pattern regions can respectively be subjected to proper exposure doses. Therefore, the same sizes in patterns between the cell projection manner and the variably shaped beam manner can be obtained.

DETAILED DESCRIPTION OF THE PREFERRED EMBODIMENTS

Figure 5:
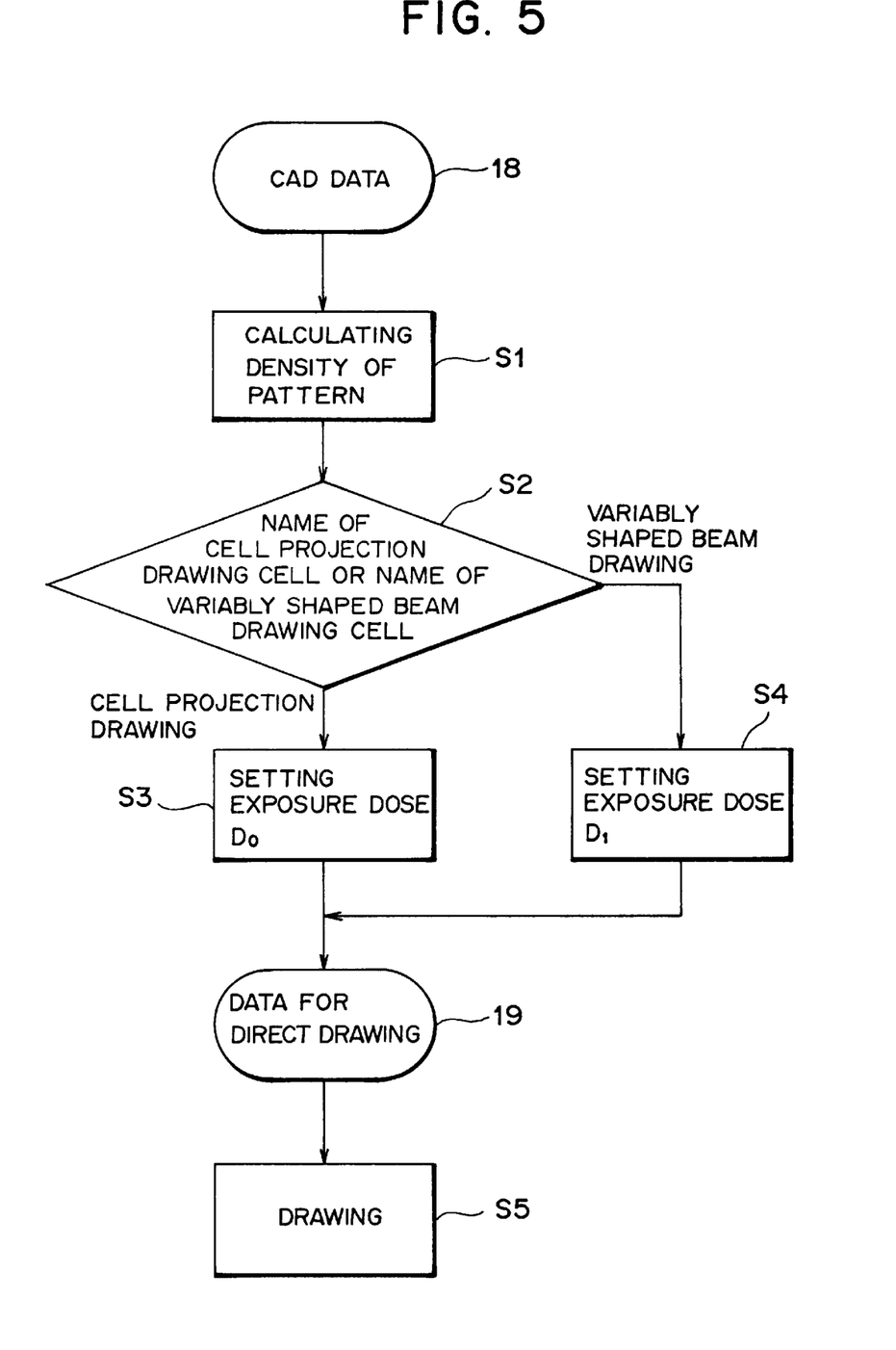
FIG. 5 is a flow chart showing an electron beam drawing method according to the first embodiment of the present invention.

An electron beam drawing method according to embodiments of the present invention will below be described in reference to the accompanying drawings in a concrete manner. FIG. 5 is a flow chart showing an electron beam drawing method according to the first embodiment of the present invention. In the embodiment, a pattern is drawn by use of the electron beam drawing system shown in FIGS. 1A and 1B in which pattern a cell projection drawing region, in which plural repetitions of a basic portion are regularly disposed, and a variably shaped beam drawing region in the surrounding of the cell projection drawing region are mixed with each other like that shown in FIG. 4.

First, a density of a drawing pattern present in a predetermined region is calculated based on a CAD data 18 (step S1). The density of a drawing pattern is defined as a total area of a drawing pattern in a predetermined region versus an area of the predetermined region.

Then, it is decided on whether the name of a cell of the drawing pattern is a name of a cell projection drawing cell or a name of a variably shaped beam drawing cell (step S2).

An exposure dose $D_0$ is set for a pattern to be drawn in a cell projection manner (step S3). An exposure dose $D_1$ is set for a pattern to be drawn in a variably shaped beam manner (step S4).

Figure 6A:
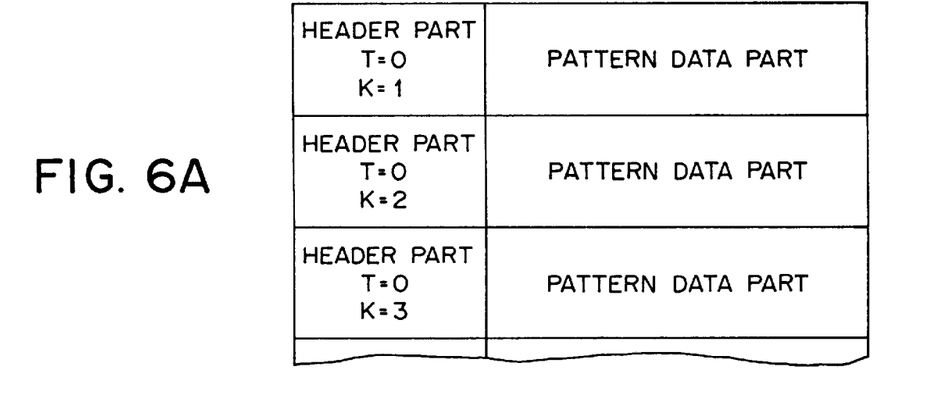
FIG. 6A is a representation showing data for cell projection drawing.
Figure 6B:
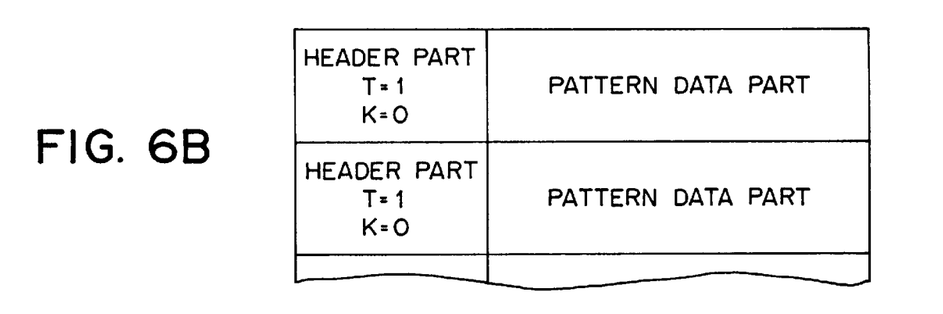
FIG. 6B is a representation showing data for variably shaped beam drawing.

FIG. 6A is a representation showing a data for cell projection drawing and FIG. 6B is a representation showing a data for variably shaped beam drawing. A data of a pattern to be drawn in the cell projection manner or the variably shaped beam manner comprises a header part and a pattern data part. In the header part, a parameter T and a parameter K are written. The parameter T is determined by a fact of which is selected from the group consisting of the exposure dose $D_0$ and $D_1$. The parameter K is determined by a fact of which is selected among the openings of the second aperture. Once an exposure dose is set for a region, parameters T and K are determined and a pattern data used for drawing in the region is selected based on a pattern data part shown in FIGS. 6A and 6B. In such a way, a pattern data for each region is determined.

Then, pattern data for respective regions are synthesized to produce a data for direct drawing 19. The data for direct drawing 19 is stored in the storage unit 95.

Thereafter, a value set for the parameter T is converted a time length of exposure by the calculator 94, the result is transmitted to the blanking electrode 82 through the controlling unit 96 and the blanking electrode 82 is made to be in the state of OFF for a time length corresponding to the set exposure time length. The cell projection beam 100b or the variably shape beam 100c is irradiated on the semiconductor wafer 91 to conduct predetermined drawing on the resist (step S5).

Figure 7:
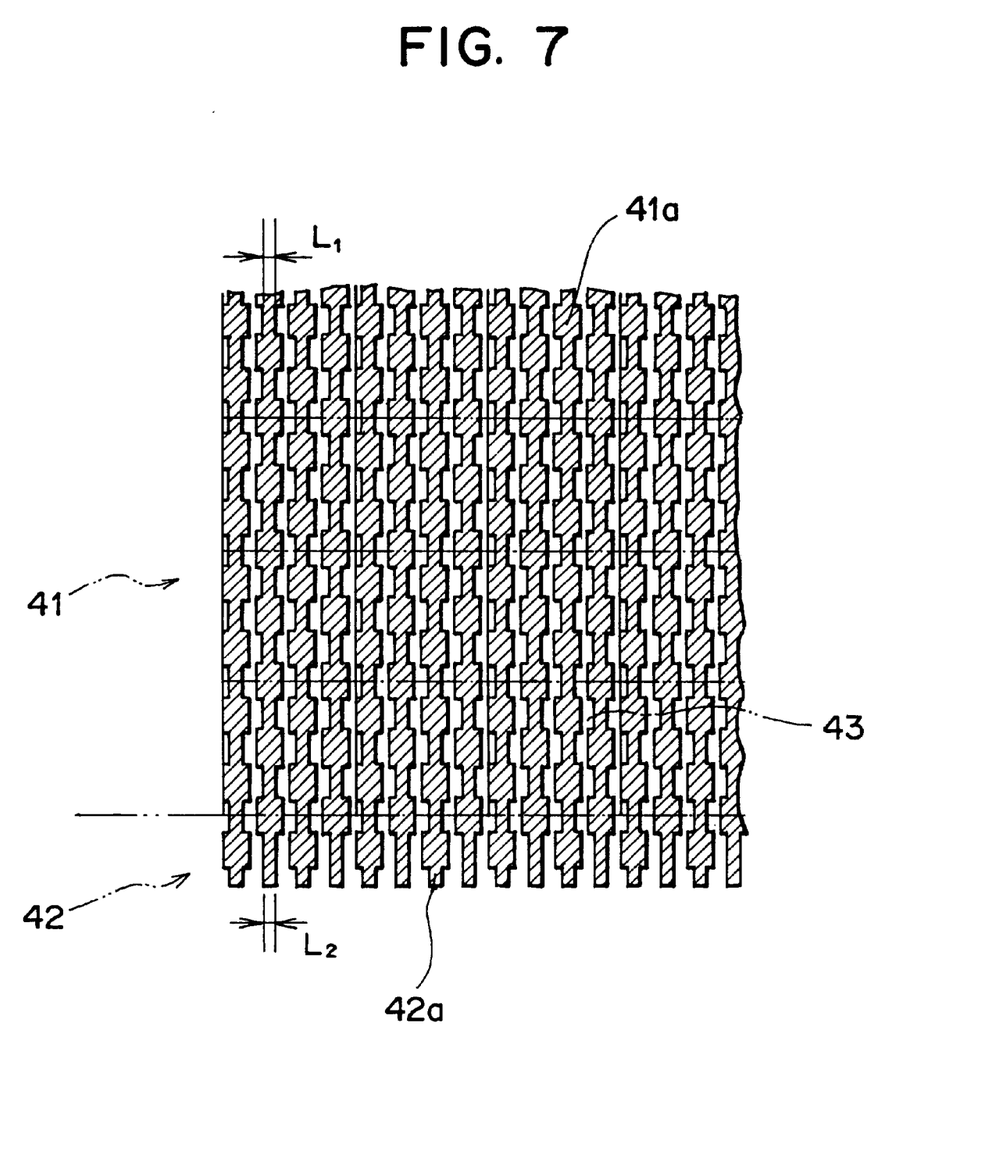
FIG. 7 is a schematic drawing showing a pattern produced by an electron beam drawing method according to the first embodiment of the present invention.

FIG. 7 is a schematic drawing showing a pattern produced by an electron beam drawing method according to the first embodiment of the present invention. It should be noted that hatching is made on a drawn latent image in FIG. 7. A pattern shown in FIG. 7 is a pattern drawn in a specimen which is prepared such that a Bare-Si substrate is coated thereon with a chemical amplification type negative resist to a thickness of 0.5 μm. An exposure dose $D_0$ of 20 ($\mu C/cm^2$) was set for drawing a pattern 41a in a cell projection drawing region 41 comprising plural repetitions of a basic portion 43. On the other hand, an exposure dose $D_1$ of 22.4 ($\mu C/cm^2$) was set for drawing a pattern 42a in a variably shaped beam drawing region 42. As a result, a size on $L_1$ of the resist in the cell projection drawing region 41 was 0.16 μm and a size $L_2$ on the resist in the variably shaped beam drawing region 42 was 0.16 μm. That is, sizes on the resist in both regions coincide with each other.

Names of the cell projection drawing cell and the variably shaped beam drawing cell may be in use as defined in CAD data 18. Names may be in use which are defined when cells are respectively taken out from the CAD data 18 as the cell projection drawing cell or the variably shaped beam exposure cell.

Figure 8:
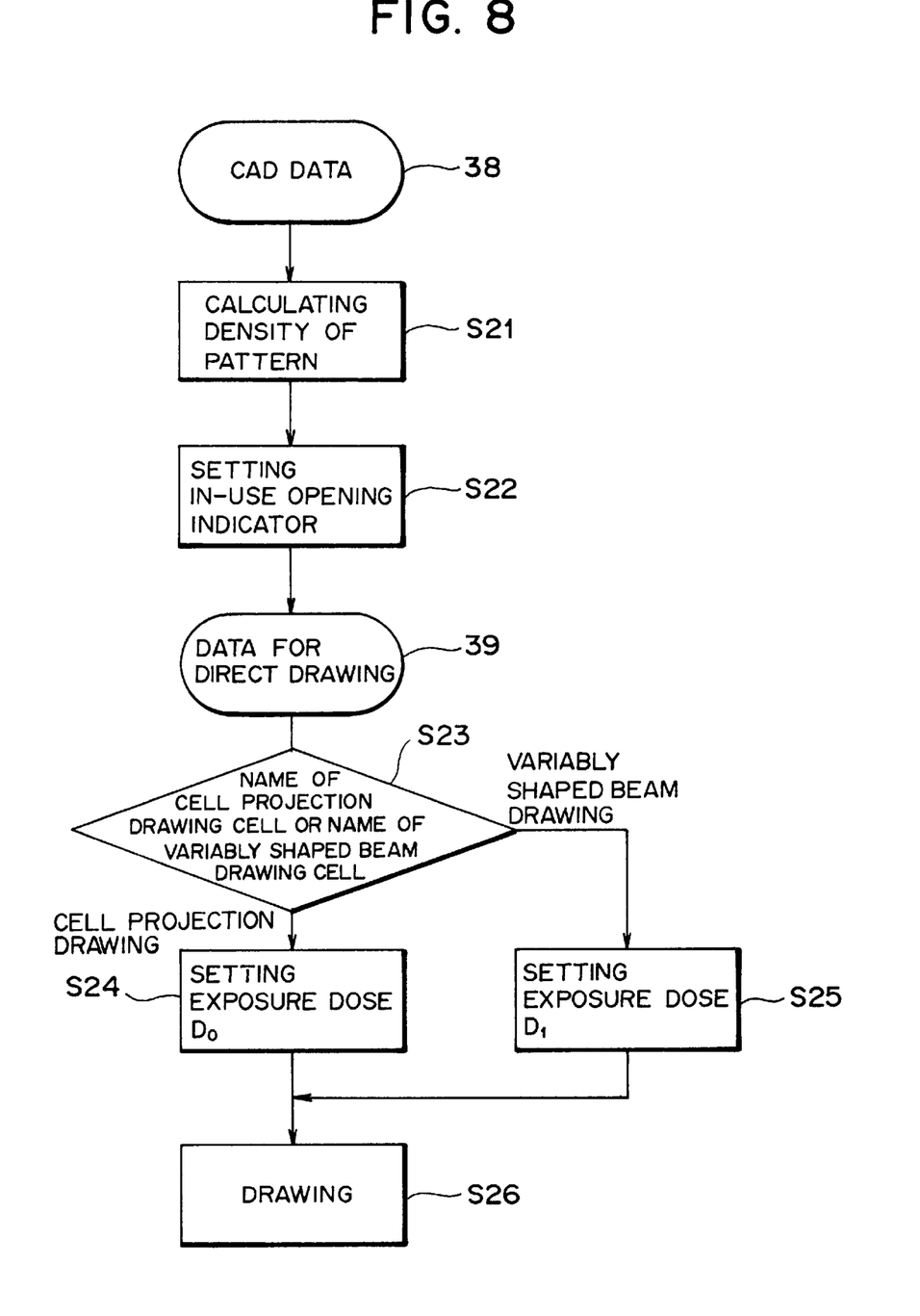
FIG. 8 is a flow chart showing an electron beam drawing method according to the second embodiment of the present invention.

The second embodiment of the present invention will be described. FIG. 8 is a flow chart showing an electron beam drawing method according to a second embodiment of the present invention. In the embodiment, too, a pattern is drawn by use of the electron beam drawing system as shown in FIGS. 1A and 1B in which pattern a cell projection drawing region, in which plural repetitions of a basic portion are regularly disposed, and a variably shaped beam drawing region in the surrounding of the cell projection drawing region are mixed with each other as shown in FIG. 4.

First, a density of a drawing pattern present in a predetermined region is calculated based on a CAD data 38 (step S21). The definition of a density of a pattern is same as that in the first embodiment.

Then, an indicator value is set which indicates a position of an opening on the second aperture, which opening is used when the pattern is drawn (step S22).

A data of the pattern is similar to those that are shown in FIGS. 6A and 6B. That is, the data of the pattern to be drawn comprises a header part and a pattern data part. Parameters T and R are written in the header part. Once an indicator value showing an opening to be used for drawing a region is set, a pattern data to be used for drawing the region is selected based on the pattern data part shown in FIGS. 6A and 6B.

Then, a pattern data for each region is synthesized to produce a data for direct drawing 39.

Subsequently, it is decided on whether the opening indicator data value is an opening indicator data value of a pattern to be drawn in a cell projection manner or an opening indicator value of a pattern to be drawn in a variably shaped beam manner (step S23).

An exposure dose $D_0$ is set for a pattern to be drawn in the cell projection manner (step S24). An exposure dose $D_1$ is set for a pattern to be drawn in the variably shaped beam manner (step S25).

Then, a value set for the parameter T is converted to an exposure time length by the calculator 94 and the result is transmitted to the blanking electrode 82 through the controlling unit 96 and the blanking electrode 82 is made to be in the state of OFF for a time length corresponding to the set exposure time length. The cell projection beam 100b or the variably shaped beam 100c is irradiated on the semiconductor wafer 91 to conduct predetermined drawing on the resist (step S26).

In the embodiment, too, a pattern shown in FIG. 7 was obtained. That is, in a specimen which is prepared such that a Bare-Si substrate is coated thereon with a chemical amplification type negative resist to a thickness of 0.5 μm, a size on $L_1$ of the resist in the cell projection drawing region 41 was 0.16 μm and a size on $L_2$ of the resist in the variably shaped beam drawing region 42 was 0.16 μm. Thus, sizes on the resist in both regions coincide with each other. In the second embodiment, too, an exposure dose $D_0$ of 20 ($\mu C/cm^2$) was set for drawing the pattern 41a in the cell projection drawing region 41. On the other hand, an exposure dose $D_1$ of 22.4 ($\mu C/cm^2$) was set for drawing the pattern 42a in the variably shaped beam drawing region 42.

Names of the cell projection drawing cell and the variably shaped beam drawing cell may be in use as defined in CAD data 18. Names may be in use which are defined when cells are respectively taken out from the CAD data 18 as the cell projection cell or the variably shaped beam drawing cell.

While in the above mentioned both embodiments, different exposure doses are respectively set for use of the cell projection manner and the variably shaped beam manner, it is needless to say that a different exposure dose and a different indicator value may be set for each opening for use in the cell projection manner.

Moreover, while process steps till the data for direct drawing 19 or 39 is produced are conducted in the outside of the system shown in FIGS. 1A and 1B, those process steps may be performed inside the system. That is, it is allowed that data such as CAD data 18 or 38 and the like are stored in the storage unit 95 and a density of a pattern and the like are calculated by the calculator 94.

What is claimed is:

1. An electron beam drawing method in which a cell projection manner and a varibly shaped beam exposure are used in combination, the method comprising:

deciding whether a pattern region in which a pattern is drawn in a resist comprises a first region to be drawn in a cell projection manner or a second region to be drawm in a variably shaped beam exposure manner with a variable shaping deflector;

selecting a first exposure dose if said pattern region comprises said first region or a second exposure dose if said pattern region comprises said second region, said second exposure dose being different from said first exposure dose; and adjusting an exposure dose prior to beam irradiation and based on a calculation regarding the pattern region selected such that said pattern is drawn with said first exposure dose in said first region and said pattern is drawn with said second exposure dose in said second region.

2. An electron beam drawing method according to claim 1, wherein a first parameter is set in advance in a first data for a pattern to be drawn in said first region;

a second parameter is set in advance in a second data for a pattern to be drawn in said second region, said second parameter being different from said first parameter;

said adjusting said exposure dose comprising:

selecting said first data by selecting said first parameter if said pattern region comprises said first region or selecting said second data by selecting said second parameter if said pattern region comprises said second region; and drawing said pattern for said first region based on said first data and drawing said pattern for said second region based on said second data respectively.

3. An electron beam drawing method according to claim 2, wherein
said first parameter is a parameter showing that said first exposure dose has been selected; and
said second parameter is a parameter showing that said second exposure dose has been selected.

4. An electron beam drawing method according to claim 2, wherein said first parameter and said second parameter are parameters which show which opening is selected from the group consisting of plural openings provided for an aperture of an electron beam drawing system used for drawing said pattern.

5. An electron beam drawing method according to claim 1, wherein said first exposure dose is smaller than said second exposure dose.

6. An electron beam drawing method according to claim 1, further comprising calculating a density of said pattern in said pattern region before deciding whether said pattern region comprises said first region or said second region.

7. An electron beam drawing method according to claim 1, wherein said first region is a region in which plural number of the same patterns are drawn and said second region is a region in which a pattern is drawn in the surrounding of said first region.

8. An electron beam drawing method according to claim 1, wherein adjusting said exposure dose comprises:
converting said first exposure dose and said second exposure dose to an exposure time length; and
making a blanking electrode of an electron beam drawing system used for drawing said pattern have an OFF state for a time length corresponding to said exposure time length.

9. An electron beam drawing method that uses a cell projection manner and a variably shaped beam exposure manner, the method comprising:
determining whether a pattern region in which a pattern is drawn comprises a first region to be drawn in a cell projection manner or a second region to be drawn in a variably shaped beam exposure manner with a variable shaping deflector;
selecting a first exposure dose if said pattern region comprises said first region or selecting a second exposure dose if said pattern region comprises said second region; and
adjusting an exposure dose prior to beam irradiation and based on a calculation regarding the pattern region selected such that said pattern is drawn with said first exposure dose in said first region and said pattern is drawn with said second exposure dose in said second region.

10. An electron beam drawing method according to claim 9, wherein
a first parameter is set in advance in a first data for a pattern to be drawn in said first region;
a second parameter is set in advance in a second data for a pattern to be drawn in said second region;
said adjusting said exposure dose comprising:
selecting said first data by selecting said first parameter if said pattern region comprises said first region or selecting said second data by selecting said second parameter if said pattern region comprises said second region; and
drawing said pattern for said first region based on said first data and drawing said pattern for said second region based on said second data respectively.

11. An electron beam drawing method according to claim 10, wherein
said first parameter comprises a parameter showing that said first exposure dose has been selected; and
said second parameter comprises a parameter showing that said second exposure dose has been selected.

12. An electron beam drawing method according to claim 10, wherein said first parameter and said second parameter comprise parameters that show which opening is selected from the group consisting of plural openings provided for an aperture of an electron beam drawing system used for drawing said pattern.

13. An electron beam drawing method according to claim 9, wherein said first exposure dose is smaller than said second exposure dose.

14. An electron beam drawing method according to claim 9, further comprising calculating a density of said pattern in said pattern region before deciding whether said pattern region comprises said first region or said second region.

15. An electron beam drawing method according to claim 9, wherein said first region comprises a region in which plural number of the same patterns are drawn and said second region comprises a region in which a pattern is drawn in the surrounding of said first region.

16. An electron beam drawing method according to claim 9, wherein adjusting said exposure dose comprises:
converting said first exposure dose and said second exposure dose to an exposure time length; and
making a blanking electrode of an electron beam drawing system used for drawing said pattern have an OFF state for a time length corresponding to said exposure time length.

* * * * *